(12) United States Patent
Yuzuriha

(10) Patent No.: US 6,551,442 B2
(45) Date of Patent: Apr. 22, 2003

(54) METHOD OF PRODUCING SEMICONDUCTOR DEVICE AND SYSTEM FOR PRODUCING THE SAME

(75) Inventor: Kojiro Yuzuriha, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/767,132

(22) Filed: Jan. 23, 2001

(65) Prior Publication Data

US 2002/0009875 A1 Jan. 24, 2002

(30) Foreign Application Priority Data

Jul. 24, 2000 (JP) .......................................... 2000-222481

(51) Int. Cl.[7] .............................................. H01L 21/00
(52) U.S. Cl. ............................ 156/345.11; 156/345.31; 118/52; 118/642; 118/72; 118/73
(58) Field of Search ................... 156/345.31, 345.11; 118/72, 73, 58, 66, 620, 641, 642, 52, 320

(56) References Cited

U.S. PATENT DOCUMENTS 5,135,608 A * 8/1992 Okutani .................. 156/345 X

FOREIGN PATENT DOCUMENTS

| JP | 5-226482 | 9/1993 |
| JP | 11-87337 | 3/1999 |
| JP | 11-162965 | 6/1999 |
| JP | 11-251312 | 9/1999 |

* cited by examiner

Primary Examiner—Thi Dang
(74) Attorney, Agent, or Firm—McDermott, Will & Emery

(57) ABSTRACT

A method of producing a semiconductor device having a multilayered wiring conductors and a system for producing the same. The nonuniformity of SOG coating film effectively suppressed and various treatments are simple and less time-consuming. A wiring conductor is formed on a semiconductor substrate, and an insulating layer covering the wiring conductor and the semiconductor substrate is formed, and the insulating layer is then subjected to a wet etching prior to the formation of SOG layer, thereby to increase a wettabiltity by the coating solution on the insulating layer.

5 Claims, 4 Drawing Sheets

US 6,551,442 B2

METHOD OF PRODUCING SEMICONDUCTOR DEVICE AND SYSTEM FOR PRODUCING THE SAME

BACKGROUND OF THE INVENTION

1. Cross-Reference to the Related Applications

This application is based on application No.2000-222481 filed Jul. 24, 2000 in Japan, the content of which is incorporated hereinto by reference.

2. Field of the Invention

The invention relates to a method of producing a semiconductor device and, more particularly, to a method capable of forming a uniform SOG coating film. The present invention also relates to a system for producing the same.

3. Description of the Related Art

With the progress of microfabrication of integrated circuits in the process dealing with semiconductor wafer, increase in number and complexity of multilayered wirings have brought about a problem associated with formation of steps on interlayer dielectric films, accompanied by increase of the risk of the wires being burn out. Therefore, an SOG layer, that is, a layer formed by the use of the SOG (Spin on Glass) technique has come to be formed on the interlayer dielectric film to render the interlayer dielectric film to be substantially flat.

FIG. 4 is a schematic sectional view of a semiconductor device having a multilayered wirings, in which the interlayer dielectric film has been rendered flat by the use of the SOC layer. In this figure, reference numeral 101 is a semiconductor substrate made of, for example, silicon, reference numerals 110 and 112 are a respective interlayer wiring conductor, reference numeral 102 is interlayer dielectric structure, and reference numeral 111 is a via hole. The interlayer dielectric structure 102 includes a first insulating layer 103, a SOG layer 104 and a second insulating layer 105.

A conventional semiconductor device has been manufactured by the following method. The wiring conductors 110 are first formed on the semiconductor substrate 101. The first insulating layer 103 made of silicon oxide is formed on the semiconductor substrate 101 by the use of plasma CVD technique so as to cover the wiring conductors 110. A coating solution containing materials for use in the practice of the SOG technique is then applied on the surface of the first insulating layer 103, opposite to the substrate 101, by the use of a spin coating method thereby to form SOG coating film. The materials generally used in the practice of the SOG technique includes inorganic SOG material, such as hydrogen silsesquioxane, or organic SOG, such as polymethylsiloxane.

Then, the resultant SOG coating film overlaying the first insulating layer 103 is fired under an oxidizing atmosphere thereby to complete the SOG layer 104 made of silicon oxide. Thereafter, the second insulating layer 105 made of silicon oxide is formed over the SOG layer 104 by the use of a plasma CVD technique, thereby completing the interlayer dielectric structure 102 made up of the first insulating layer 103, the SOG layer 104 and the second insulating layer 105.

A photoresist layer having with a perforation that eventually defines the via hole 111 is then formed on the interlayer dielectric structure 10 by means of lithography. A portion of the interlayer dielectric structure 102 aligned with the perforation of the photoresist is subsequently dry-etched off, leaving the via hole 111 that extends to the wiring conductor 110. After the formation of the via hole 111, the photoresist layer is removed, followed by deposition of a wire material on the interlayer dielectric struture 102 so that the via hole 111 can be filled up. The material so deposited is then patterned by preferential dry etching, thereby forming the wiring conductor 112 through the via hole 111.

However, it has been found that when the insulating layer 103 is exposed to the elevated temperature evolved by generation of plasma in the CVD reactor or is subjected to a heat treatment, the surface of the insulating layer 103 to become hydrophobic. Also, there is another problem in that contaminants, such as, silicon, hydrogen, and/or nitrogen, which are unreacted materials at the time of depositing silicon oxide layer by the plasma CVD technique, or organic materials are deposited on the surface of the insulating layer 103. These problems amount to difficulty in wetting the insulating layer 103 with the coating solution containing the SOG materials which eventually results in the non uniformity of the SOG coating film. Thus, the flatness of the interlayer dielectric layer is lowered, which in turn results in collapse of the via hole and the short-circuiting between the wiring conductors during formation of the via hole and/or the wiring conductors.

In order to substantially eliminate these problems, some methods have been suggested. For example, Japanese Patent Laid-open Publication No. 11-251312 discloses the method of making the insulating layer 103 hydrophilic by means of oxygen plasma treatment, and Japanese Patent Laid-open Publication No. 11-162965 and No. 11-87337 disclose the method of removing the contaminants with ozone through the UV irradiation treatment. Japanese Patent Laid-open Publication No. 5-226482 discloses the use of a combination of a heating treatment, an oxygen plasma treatment and an UV irradiation treatment.

However, these prior art methods are ineffective to provide the hydrophilic surface. It is therefore desired to provide the method that is capable of reducing the nonuniformity of the SOG coating film. It is also desired to provide the method that is simple and less time-consuming in order to reduce the processing cost.

SUMMARY OF THE INVENTION

An object of the present invention is therefore to provide a method of producing the semiconductor device, which is simple and less time-consuming and, also, capable of suppressing the nonuniformity in thickness of the SOG coating film.

It is an another important object of the present invention to provide a system of producing the semiconductor device of the kind referred to above.

In order to achieve the object described above, the method of producing a semiconductor device of the present invention includes the steps of patterning a wiring conductor on a semiconductor substrate, forming an insulating layer on the semiconductor substrate so as to cover the wiring conductor, performing a wet-etching process subject to the insulating layer on the semiconductor substrate to increase a wettability thereof and applying a coating solution containing SOG materials on an entire surface of the insulating layer to form an SOG that compensates for surface irregularities appearing on one of opposite surfaces of the insulating layer.

In the method of the present invention, the insulating layer is subjected to wet etching prior to the formation of SOG layer, thereby removing the contaminants such as silicon oxide that is deposited on the surface of the insulating layer. At that time, Si—O—Si bonding which constitutes a cause of the hydrophobic surface of the insulating layer is removed. The contaminants of organic materials deposited on the surface of the insulating layer are also removed. Accordingly, the surface of the insulating layer can exhibit a hydrophilic character, so that the surface of the insulating layer can easily be wetted with the coating solution, and the nonuniformity of the SOG coating film can be thereby suppressed.

Furthermore, the wet etching can be carried out by, for example, dipping in the etching solution the semiconductor substrate having the insulating layer. Accordingly, the wet etching makes the etching process to be simple and less time-consuming.

Also according to the present invention, the method may include the step of heating the semiconductor substrate at a temperature within the range of 100 to 500° C. after the insulating layer has been wet-etched.

Also according to the present invention, hydrogen fluoride solution may be employed in the wet etching step as an etching solution.

Also according to the another aspect of the present invention, there is provided a method including the steps of patterning a wiring conductor on a semiconductor substrate, forming an insulating layer on the semiconductor substrate so as to cover the wiring conductor, bringing the insulating layer into contact with a hydrophilic solvent to increase a wettability thereof and applying a coating solution containing SOG materials on an entire surface of the insulating layer to form an SOG that compensates for surface irregularities appearing on one of opposite surfaces of the insulating layer remote from the semiconductor substrate.

According to this method, contaminants, such as the organic materials, depositing on the surface of the insulating layers can be dissolved or flowed away in contact with the hydrophilic solvent and can therefore be removed from the surface of the insulating layer. Thus, the surface of the insulating layer is rendered to be hydrophilic and, hence, has a wettability to the coating solution. This makes it possible to suppress the nonuniformity of the SOG coating film. Furthermore, a simple operation such as contacting the insulating layer with the hydrophilic solvent can make the process to be simple and less time-consuming.

The hydrophilic solvent that can be employed in the practice of the present invention may be selected from the group consisting of methyl alcohol, ethyl alcohol, n-propyl alcohol and isopropyl alcohol.

The present invention also provides a system including a pretreatment section for treating a surface of an insulating layer formed on a semiconductor substrate having a patterned wiring conductor thereon, a SOG coating section for applying a coating solution to an entire surface of the insulating layer to form a SOG coating film, a SOG treatment section for firing the SOG coating film, and a transport apparatus for carrying the semiconductor substrate from the pretreatment section to the SOG coating section and further to the SOG treatment section. The pretreatment section referred to above includes at least one of a wet etching section and a solvent treatment section.

Also according to the present invention, the wet etching section may include an etching vessel containing an etching solution for etching the insulating layer, a wash vessel positioned adjacent the etching vessel for removing the etching solution from the semiconductor device having the insulating layer thereon, and an oven positioned adjacent the wash vessel for drying the semiconductor device having the insulating layer thereon.

The solvent treatment section may include a rotary coating apparatus having a rotating stage for placing the semiconductor device having the insulating layer thereon, and solvent supply apparatus for supplying the solvent onto the surface of the insulating layer.

The pretreatment section may also include at least one of a generator for oxygen plasma and an ultra-violet irradiator.

The transport section may include a carrier rail, a transport apparatus supported movably along the carrier rail, and a supporting apparatus for supporting the semiconductor device then attached to the transport apparatus for movement up and down.

The supporting apparatus may include a hanging arm connected to the carrier for movement up and down with, a supporting member for supporting a peripheral portion of the semiconductor device then rotatably attached to the hanging arm, a holding pad mounted on one end portion of the supporting member, and a connecting member for connecting the hanging arm to the supporting member.

BRIEF DESCRIPTION OF THE DRAWINGS

The above and other objects and features of the present invention will become more apparent from the following description of the preferred embodiments thereof made with reference to the accompanying drawings, throughout which like parts are designated by like reference numerals and which.

DESCRIPTION OF THE PREFERRED EMBODIMENTS

Embodiment 1

Figure 3:
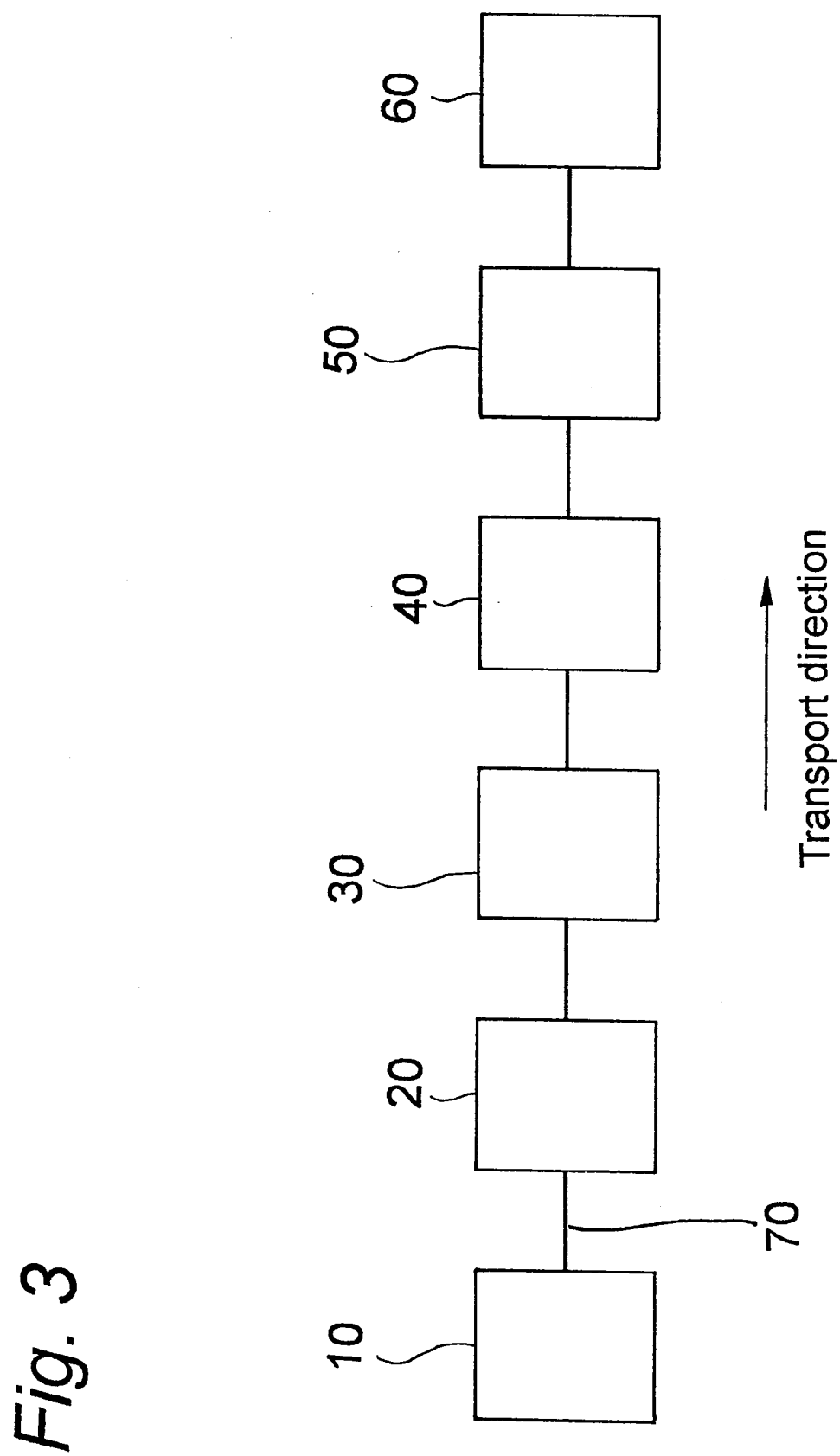
FIG. 3 is a schematic flow diagram showing the method of producing the semiconductor device according to the first embodiment of the present invention.
Figure 4:
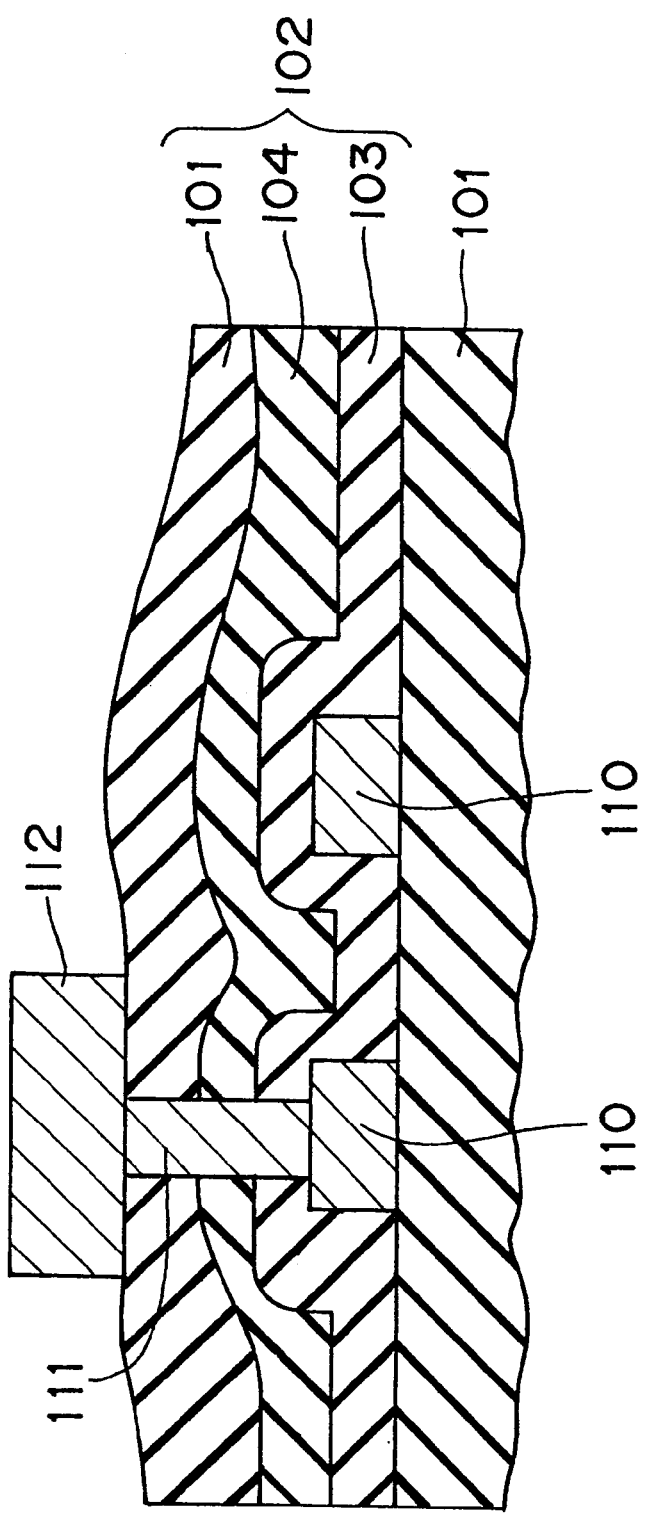
FIG. 4 is a schematic sectional view showing the structure of the semiconductor device having the multilayered wiring conductors.

Referring to FIG. 3, there is shown various processing units of the system of the present invention that are shown in sequence of the process of making a semiconductor device according to the first embodiment of the present invention. The system shown therein includes a carry-in station for receiving a semiconductor wafer 10, a pretreatment section 20, a SOG coating section 30, a first SOG treatment section 40, a second SOG treatment section 50 and a carry-out station for delivering the wafer 60 that has been processed. The wafer 10 having an insulating layer formed thereon is transported by the transport section 70 from the carry-in station of wafer 10 to the pretreatment section 20 where insulating layer is subjected to the hydrophilic treatment. A SOG coating film is subsequently formed on the surface of the insulating layer in the SOG coating section 30. The SOG coating film so formed is fired in the first SOG treatment section 40 and then in the second SOG treatment section 50. Thereafter, the wafer is transported through the carry-out station of wafer 60 to the next processing station where, for example, wiring conductors are formed.

The wafer carry-in station 10 includes a rotatable and vertically shiftable stage (not shown) for supporting the wafer for rotation and also for movement up and down. The wafer carried from the outside is placed on the stage and is held in a stand-by state.

The carrier section 70 includes a carrier rail extending in a direction in which the wafer is desired to be transported and a transport apparatus (not shown). The wafer held in a stand-by state in the wafer carry-in station is held by a wafer supporting member (not shown) of the carrier apparatus so that the peripheral portion of the wafer is sandwiched by the supporting member, the wafer is then hanged up by the carrier apparatus to carry into the pretreatment section 20.

The pretreatment section includes at least one of the wet etching section, the solvent treatment section, the oxygen plasma generator and the ultraviolet irradiator.

Figure 1:
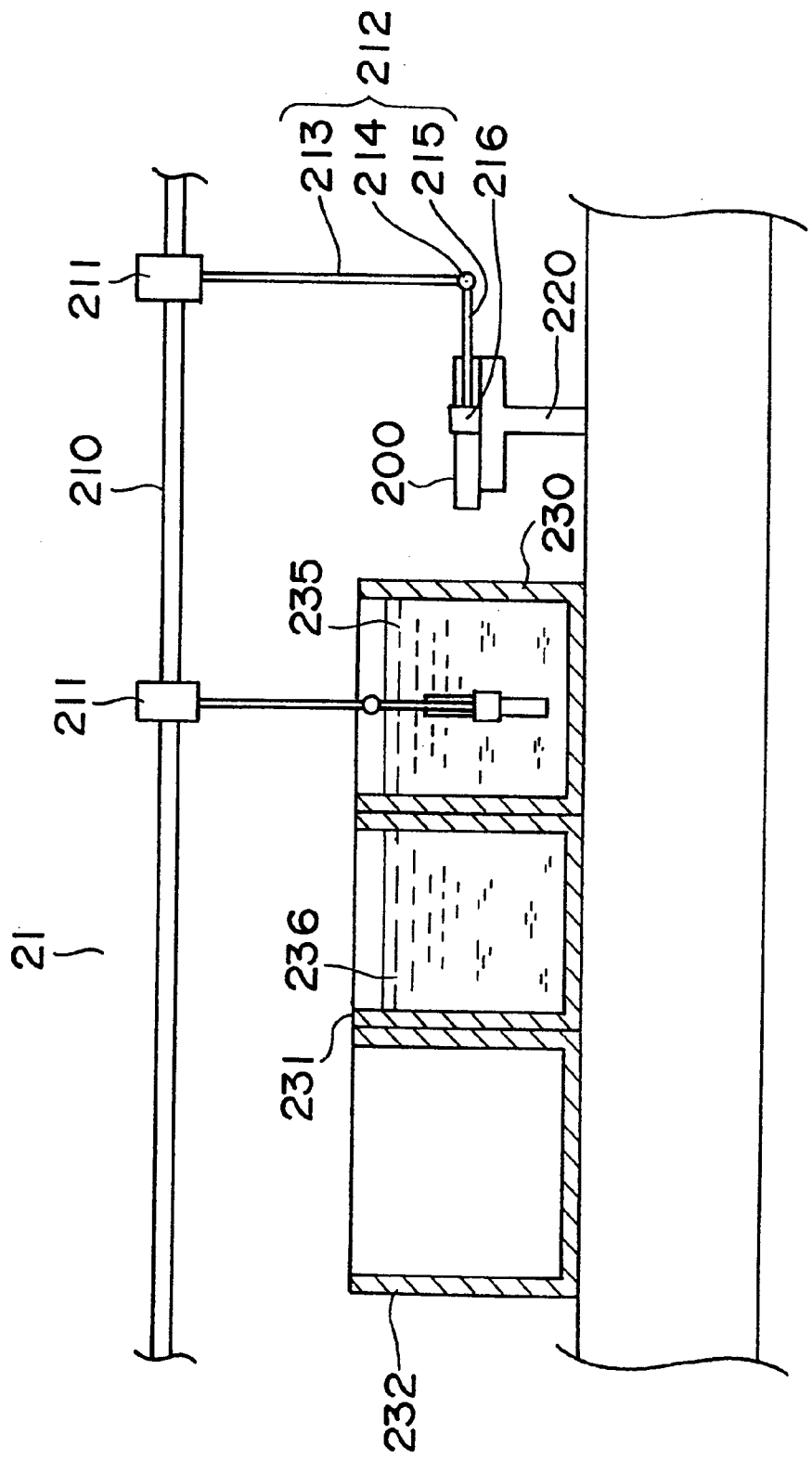
FIG. 1 is a schematic side view, with portions shown in section, showing a wet etching section used in the practice of the method of producing the semiconductor device according to the first embodiment of the present invention.

Referring now to FIG. 1, the wet etching section 21 is shown in detail therein. The wafer 200 is delivered from the wafer carry-in station 10 to the wet etching section 21 by the carrier apparatus 211. The carrier apparatus 211 is attached to the carrier rail 210 so that the carrier apparatus 211 can move along the carrier rail 210. The wafer 200 so delivered is placed temporarily on the stage 220 which can move up and down. The supporting apparatus 212 for holding the wafer 200 is attached to the carrier apparatus 211. The supporting apparatus 212 includes a hanging arm 213 connected to the carrier apparatus 211 for movement up and down in a direction axially thereof, a pair of supporting members 215 capable of holding the peripheral portion of the wafer and of rotating the wafer, a holding pad 216 attached to a lower end portion of the supporting members 215, and a connecting member 214 connecting the hanging arm 213 to supporting members 215. The up and down motion of the hanging arm 213 and the rotation of the supporting member 215 are controlled by a controller (not shown).

Then the wafer is transported to a position immediately above a etching vessel 230 containing an etching solution 235 and is subsequently immersed in the etching solution 235 as the hanging arm 213 carrying the wafer 200 is lowered, wherefore the wafer 200 is wet-etched for a determined time. After the predetermined time, the wafer 200 is pulled up from the etching solution 235 as the hanging arm 213 elevates, and is then transported to a position immediately above the next adjacent washing vessel 231 containing a washing solution 236. The wafer 200 is then immersed in the washing solution 236 upon lowering of the hanging arm 213, thereby to remove the etching solution then wetting the wafer 200.

Thereafter, the wafer 200 is again pulled up from the washing solution 236 upon elevation of the hanging arm 213, and is transported to a position immediately above a drying vessel 232 following the washing vessel 231. The hanging arm 213 is lowered down to a predetermined level so that the wafer can be hung therefrom at a predetermined height above the bottom of the drying vessel 232.

Within the drying vessel 232, a vapor of the isopropyl alcohol is directed to the surface of the wafer 200 so that water wetting the surface of the wafer is blown off by a current of the isopropyl alcohol and, thereafter, the isopropyl alcohol is removed by heating the wafer 200. After drying the wafer 200, the wafer 200 is pulled up from the drying vessel 232 by the hanging arm 213 then moving upwards, and is transported to the SOG coating section 30.

Examples of the etching solutions, which can be employed in the present invention, include a hydrogen fluoride solution, a solution containing a mixture of the hydrogen fluoride solution and a solution containing fluoride ions, and a solution containing a mixture of the hydrogen fluoride solution and a nitric acid. The hydrogen fluoride is preferable, because the hydrogen fluoride of a high purity can readily be available and can result in a high etching rate.

In this way, the wafer is wet etched, washed and dried. It is, however, preferred that the wafer is subjected to heating under an oxidizing atmosphere after drying. The heating temperature is preferably within the range of 100 to 500° C., more preferably within the range of 300 to 500° C. The insulating layer is usually formed by using CVD method and may often contain a small amount of unreacted materials, such as silicon (Si), atomic hydrogen (H) and atomic nitrogen (N). The heating treatment under the oxidizing atmosphere makes it possible to remove H and N, which are hard to remove by wet etching, and also to oxidize the unreacted Si to silicon oxide. Thus, the removal of those unreacted materials results in the insulating layer having a hydrophilic property.

The pretreated wafer is subsequently transported to the SOG coating section 30. The SOG coating section 30 is similar in structure to the solvent treatment section 22. The coating solution containing the SOG materials is supplied onto the surface of the wafer placed on the rotating stage, thereby to form the SOG coating film on the insulating film.

The SOG coating film is fired in the first SOG treatment section 40 and the second SOG treatment section 50 successively. In the first SOG treatment section 40, the SOG coating film is fired under an inert atmosphere to form a precursor of silicon oxide. For example, the firing in the first treatment section may be carried out continuously at a temperature of 150° C. for 1 minute, then at a temperature of 200° C. for 1 minute and finally at a temperature of 300° C. for 1 minute. In the second SOG treatment section 50, the precursor of silicon oxide is fired to form silicon oxide. For example, the firing in the second treatment section may be carried out for 60 minutes at a temperature of 400° C. under the oxidizing atmosphere such as oxygen, or the mixture of oxygen and nitrogen.

After the SOG coating film has been fired, the wafer is transported through the carry-out station 60 to the next succeeding processing station where an additional insulating layer and wiring conductors are formed.

According to this embodiment, a siloxan bond (Si—O—Si) which causes the insulating layer to be hydrophilic, and also the contaminants such as the organic materials sticking to the surface of the insulating layer are removed as dissolved during the wet etching the surface of the insulating layer. As a result, the surface of the insulating layer is made to be hydrophilic and the wettability to the coating solution is improved, thereby to suppress the nonuniformity of the SOG coating film.

Embodiment 2

Figure 2:
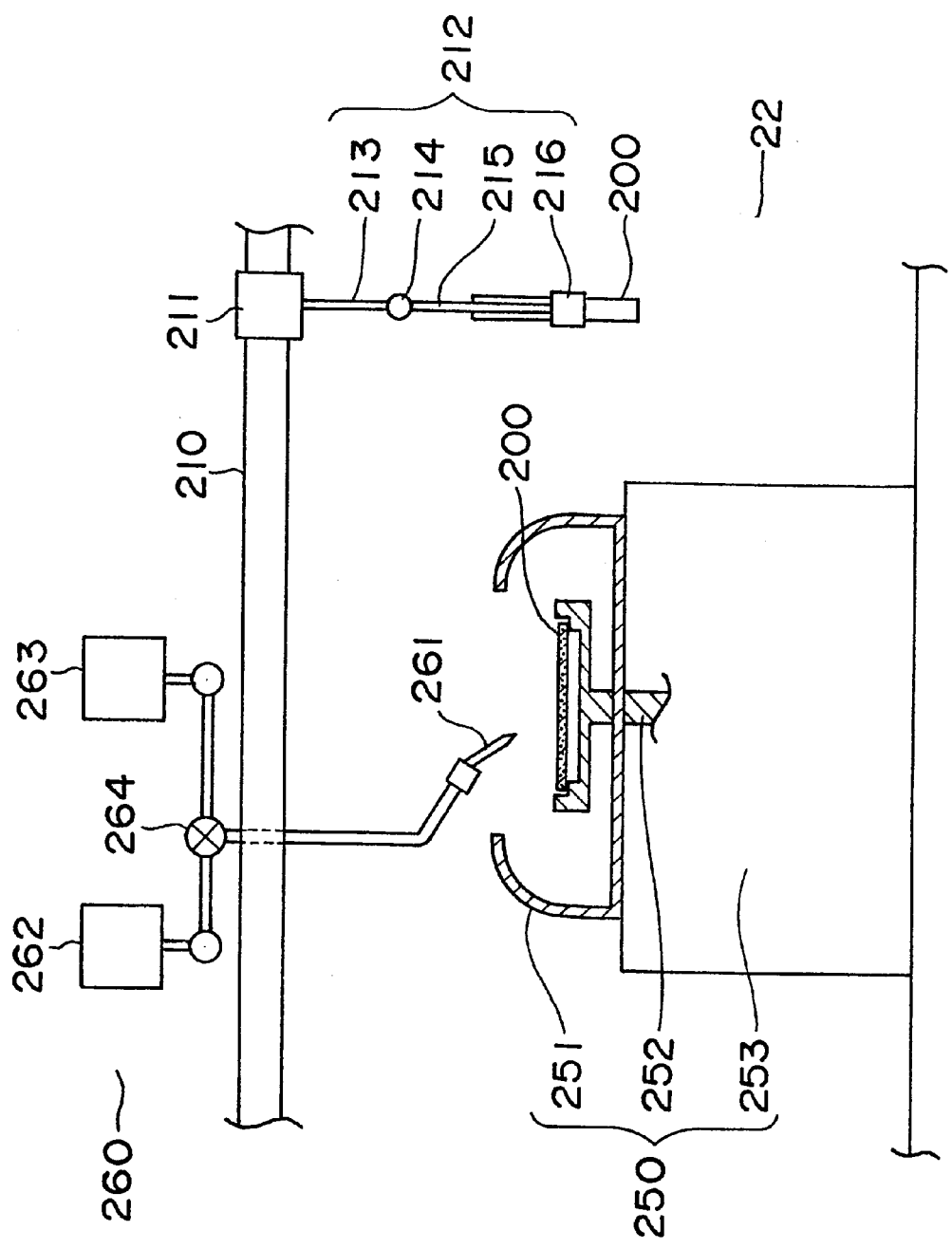
FIG. 2 is a schematic side view, with portions shown in section, showing a solvent treatment section used in the practice of the method of producing the semiconductor device according to the second embodiment of the present invention.

In the second embodiment, the system is similar in construction to that according to the foregoing embodiment, except for a solvent treatment section provided in the system of FIG. 2 as a pretreatment section.

FIG. 2 is a schematic side view showing the structure of the solvent treatment section. The solvent treatment section 22 includes rotary coating apparatus 250 and solvent supply apparatus 260.

The wafer 200 is transported to a position immediately above the rotary coating apparatus 250 from the wafer carry-in station 10 and is, as the hanging arm 213 is lowered, placed on the rotary stage 252 connected with a driving apparatus 253. A cup 251 capable of moving up and down and surrounds the rotary stage 252 when lowered, facilitate the wafer 200 to be placed on the rotary stage 252.

The solvent supply section 260 includes a solvent tank 262, a washing water tank 263, a changeover valve 264 and a nozzle 261. The hydrophilic solvent is sprayed from the nozzle 261 to the surface of the rotating wafer 200 placed on the rotary stage 252, so that the entire surface of the wafer 200 can be coated with the hydrophilic solvent. At this time, the changeover valve 264 is in position to communicate the nozzle 261 with the solvent tank 262. However, after the solvent has been applied to the wafer 200, the changeover valve 264 is switched to a different position in which the nozzle 261 is communicated with the washing water tank 263 so that the washing water can be sprayed onto the surface of the wafer to replace the hydrophilic solvent wetting to the surface of the wafer with the washing water. The supply of the washing water is then stopped, and the wafer 200 is subjected to a continue rotation so that the water on the wafer 200 can be removed to dry the wafer.

The hydrophilic solvent which may be employed in the present invention include solvents having a low boiling point and a low toxicity, such as methyl alcohol, ethyl alcohol, n-propyl alcohol and isopropyl alcohol. Isopropyl alcohol is preferable.

According to the second embodiment, since the alcohol employed in the cleaning process is supplied to the surface of the rotating wafer, it is possible to make the pretreatment simple and less time-consuming.

It is possible to carry out the solvent treatment only, and also possible to carry out the solvent treatment in combination with the wet etching. In the latter case, it is preferable to carry out the solvent treatment following the wet etching. The wafer can be dried by the solvent treatment without drying treatment.

Embodiment 3

In the third embodiment, the system is similar in construction to that according to the first embodiment, except for that in the third embodiment, an ultraviolet irradiation section is added to the wet etching section in the pretreatment section.

The ultraviolet irradiator includes an ultra-violet lamp, a casing for installing the ultraviolet lamp, a stage for placing the wafer and a reactor for setting the stage therein, whereby the reactor can introduce the air and evacuate the gas inside. When the ultraviolet rays irradiate the wafer, the contaminants sticking to the wafer such as the organic materials is decomposed not only by the ultraviolet directly, but by ozone generated from the air existing between the space of the casing and the wafer.

According to the third embodiment, in addition to the effects obtained in the first embodiment, other effects can be obtained. For example, the small contaminants of, for example, not greater than 0.1 $\mu$m in size can be effectively removed. Accordingly, when the ultraviolet irradiation treatment is applied to the pretreatment process for processing devices of a level of 0.18 $\mu$m so that the ultraviolet light irradiation can be carried out after the wet etching and the solvent treatment, the small contaminants can be effectively removed.

Embodiment 4

In the fourth embodiment, the system is similar in construction to that according to the first embodiment, except for an oxygen plasma generator added to the wet etching section in the pretreatment section in accordance with the fourth embodiment. The oxygen plasma generator includes a conventional plasma reactor. The oxygen plasma is generated from oxygen introduced into the plasma reactor. The oxygen plasma can decompose the organic contaminants sticking to the insulating layer.

According to the fourth embodiment, in addition to the effects obtained in the first embodiment, other effects can be obtained. For example, the small contaminants of not greater than 0.1 $\mu$m can be effectively removed. Accordingly, when the oxygen plasma treatment is applied to the pretreatment process for processing devices of a level of 0.18 $\mu$m so that the oxygen plasma treatment can be carried out after the wet etching and the solvent treatment, the small contaminants can be effectively removed.

The following is test results showing the effects of the present invention. After the SOG coating film has been fired, the surface defects of the wafer were examined. This examination is carried out by counting the number of spot-like contaminants due to the air entrapped in the nonuniform SOG coating film. The smaller the number of the spot-like contaminants, the more the nonuniformity of the SOG coating film can be suppressed. Without the pretreatment, the number of the spot like contaminants was 5700 pieces per one wafer. When the wet etching using hydrogen fluoride as the etching solution was carried out, the number of the spot-like contaminants was 370 pieces per one wafer. And when the solvent treatment using isopropyl alcohol was carried out, the number of the spot like contaminants was 1100 pieces per one wafer.

As described above, since the wiring conductors are patterned on a semiconductor substrate and the insulating layer is formed to cover the wiring conductors, and since the semiconductor substrate and the insulating layer is wet etched prior to the formation of SOG layer, the wettabiltity of the insulating layer to the coating solution can be increased simply and rapidly. Thus the nonuniformity of the SOG coating film can be suppressed.

Also according to the method of the present invention, since the semiconductor substrate is heated at a temperature within the range of 100 to 500° C. under the oxidizing atmosphere after the insulating layer has been wet-etched, the unreacted Si can be reduced. Thus the wettabiltity of the insulating layer can be much more increased.

Also according to the method of the present invention, since the hydrogen fluoride solution is employed in the wet etching as an etching solution, a time necessary for wet-etching can be reduced.

Also according to the method of the present invention, the wiring conductors are patterned on a semiconductor substrate and the insulating layer is formed to cover the wiring conductors, and the insulating layer are brought into contact with the hydrophilic solvent prior to the formation of SOG layer, the wettabiltity of the insulating layer can be increased. Thus the nonuniformity of the SOG coating film can be suppressed.

Also according to the method of the present invention, since the solvent is selected from the group consisting of methyl alcohol, ethyl alcohol, n-propyl alcohol and isopropyl alcohol, the treatment can be carried out safely and rapidly.

Also according to the system of the present invention, since the system includes the pretreatment section for treating the surface of the insulating layer formed on the semiconductor substrate having the patterned wiring conductor thereon, the SOG coating section for applying the coating solution to the entire surface of the insulating layer to form the SOG coating film, the SOG treatment section for firing the SOG coating film, and the transport section for carrying the semiconductor substrate from the pretreatment section to the SOG coating section and further to the SOG treatment section, and the pretreatment section further includes at least one of the wet etching section and the solvent treatment section, the system can be made simple in structure and the uniform SOG coating film can be formed easily.

Also according to the system of the present invention, since the wet etching section includes the etching vessel, the wash vessel positioned adjacent the etching vessel and the oven positioned adjacent the wash vessel, the treatment can be carried out rapidly.

Also according to the system of the present invention, since the solvent treatment section includes the rotary coating apparatus and solvent supply apparatus, and the solvent is supplied onto the surface of the insulating layer while the semiconductor substrate is rotated, the solvent treatment can be carried out rapidly.

Also according to the system of the present invention, the pretreatment section further includes at least one of the oxygen plasma generator and the ultraviolet irradiator, smaller size of the contaminants can be removed thereby suppressing the nonuniformity of SOG coating film much more.

Also according to the system of the present invention, since the carrier section includes the carrier rail, the carrier apparatus and the supporting apparatus for supporting the semiconductor device then attached to the carrier apparatus for movement up and down, the semiconductor device can be transported to each section rapidly. Thus the rapid treatment can be attained.

Also according to the system of the present invention, since the supporting section includes the hanging arm connected with the carrier for movement up and down with, the supporting member for supporting a peripheral portion of the semiconductor device then rotatably attached to the hanging arm, the holding pad mounted on the end portion of the supporting member, and the connecting member for connecting the hanging arm to the supporting member, the movement up and down and also the rotation of the semiconductor device can be easily made. Thus the rapid treatment can be attained.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be constructed as being included therein.

What is claimed is:

1. A system for a method of producing a semiconductor device having a multilayered wirings, said method comprising a patterning a wiring conductor on a semiconductor substrate, forming an insulating layer on the semiconductor substrate, forming an insulating layer on the semiconductor substrate so as to cover the wiring conductor, and applying a coating solution containing SOG materials on an entire surface of the insulating layer to form an SOG that compensates for surface irregularities appearing on one of opposite surfaces of the insulating layer remote from the semiconductor substrate, said system comprising:

a pretreatment section for treating a surface of an insulating layer formed on a semiconductor substrate having a patterned wiring conductor thereon, said pretreatment section comprising at least one of a wet etching section and a solvent treatment section;

a SOG coating section for applying the coating solution on an entire surface of the insulating layer to form a SOG coating film;

a SOG treatment section for firing the SOG coating film; and a transport section for carrying the semiconductor substrate from the pretreatment section to the SOG coating section and further to the SOG treatment section, wherein said wet etching section comprises an etching vessel containing an etching solution for etching the insulating layer, a wash vessel positioned adjacent the etching vessel for removing the etching solution from the semiconductor device having the insulating layer thereon, and an oven positioned adjacent the wash vessel for drying the semiconductor device having the insulating layer thereon.

2. A system for a method of producing a semiconductor device having a multilayered wirings according to claim 1, wherein said solvent treatment section comprising a rotary coating apparatus having a rotating stage for placing the semiconductor device having the insulating layer thereon, and a solvent supply apparatus for supplying the solvent on the surface of the insulating layer.

3. A system for a method of producing a semiconductor device having a multilayered wirings according to claim 1, wherein said pretreatment section further comprises at least one of an oxygen plasma generator and an ultraviolet irradiator.

4. A system for a method of producing a semiconductor device having a multilayered wirings, said method comprising a patterning a wiring conductor on a semiconductor substrate, forming an insulating layer on the semiconductor substrate, forming an insulating layer on the semiconductor substrate so as to cover the wiring conductor, and applying a coating solution containing SOG materials on an entire surface of the insulating layer to form an SOG that compensates for surface irregularities appearing on one of opposite surfaces of the insulating layer remote from the semiconductor substrate, said system comprising:

a pretreatment section for treating a surface of an insulating layer formed on a semiconductor substrate having a patterned wiring conductor thereon, said pretreatment section comprising at least one of a wet etching section and a solvent treatment section;

a SOG coating section for applying the coating solution on an entire surface of the insulating layer to form a SOG coating film;

a SOG treatment section for firing the SOG coating film under an oxidizing atmosphere; and a transport section for carrying the semiconductor substrate from the pretreatment section to the SOG coating section and further to the SOG treatment section, wherein said transport section comprises a carrier rail, a carrier apparatus supported movably along the carrier rail, and a supporting apparatus for supporting the semiconductor device then attached to the carrier apparatus for movement up and down.

5. A system for a method of producing a semiconductor device having a multilayered wirings, said method comprising a patterning a wiring conductor on a semiconductor substrate, forming an insulating layer on the semiconductor substrate, forming an insulating layer on the semiconductor substrate so as to cover the wiring conductor, and applying a coating solution containing SOG materials on an entire surface of the insulating layer to form an SOG that compensates for surface irregularities appearing on one of opposite surfaces of the insulating layer remote from the semiconductor substrate, said system comprising:

a pretreatment section for treating a surface of an insulating layer formed on a semiconductor substrate having a patterned wiring conductor thereon, said pretreatment section comprising at least one of a wet etching section and a solvent treatment section;

a SOG coating section for applying the coating solution on an entire surface of the insulating layer to form a SOG coating film;

a SOG treatment section for firing the SOG coating film under an oxidizing atmosphere; and a transport section for carrying the semiconductor substrate from the pretreatment section to the SOG coating section and further to the SOG treatment section, wherein said transport section comprises a carrier rail, a carrier apparatus supported movably along the carrier rail, and a supporting apparatus for supporting the semiconductor device then attached to the carrier apparatus for movement up and down; and wherein said supporting apparatus comprises a hanging arm connected to the carrier apparatus for movement up and down with, a supporting member for supporting a peripheral portion of the semiconductor device then rotatably attached to the hanging arm, a holding pad mounted to one end portion of the supporting member, and a connecting member for connecting the hanging arm to the supporting member.

* * * * *